(12) United States Patent
Cai et al.

(10) Patent No.: US 11,175,357 B2
(45) Date of Patent: Nov. 16, 2021

(54) MAGNETIC SENSOR DEVICE

(71) Applicant: TDK Corporation, Tokyo (JP)

(72) Inventors: Yongfu Cai, Tokyo (JP); Yuta Saito, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 16/877,801

(22) Filed: May 19, 2020

(65) Prior Publication Data

US 2021/0096194 A1    Apr. 1, 2021

(30) Foreign Application Priority Data

Oct. 1, 2019    (JP) .............................. JP2019-181747

(51) Int. Cl.
*G01R 33/09* (2006.01)
*G01R 15/20* (2006.01)

(52) U.S. Cl.
CPC ......... *G01R 33/091* (2013.01); *G01R 15/207* (2013.01); *G01R 33/093* (2013.01)

(58) Field of Classification Search
CPC . G01R 15/207; G01R 33/093; G01R 33/0076
See application file for complete search history.

(56) References Cited

U.S. PATENT DOCUMENTS

| 2015/0192432 A1 | 7/2015 | Noguchi et al. | |
| 2016/0223623 A1* | 8/2016 | Deak | G01R 33/091 |
| 2017/0276739 A1* | 9/2017 | Obana | G01R 33/0011 |
| 2018/0156874 A1* | 6/2018 | Nagata | G01R 33/0005 |
| 2019/0041473 A1 | 2/2019 | Tanabe | |

FOREIGN PATENT DOCUMENTS

| JP | 2015-129697 A | 7/2015 |
| JP | 2017-167021 A | 9/2017 |

OTHER PUBLICATIONS

English translation of Office Action dated Oct. 5, 2021 issued in corresponding JP patent application No. 2019-181747.

* cited by examiner

*Primary Examiner* — Alvaro E Fortich
(74) *Attorney, Agent, or Firm* — Posz Law Group, PLC

(57) ABSTRACT

A magnetic sensor device includes a magnetic field converter that receives an input magnetic field input along a first direction and outputs an output magnetic field along a second direction, which is orthogonal to the first direction. A magnetic field detector is provided at a position where the output magnetic field can be applied. A magnetic shield that blocks an external magnetic field along the second direction, is provided. The magnetic field converter has a shape in which the length in a third direction, which is orthogonal to both the first direction and the second direction, is longer than the length in the second direction, when viewed along the first direction. The magnetic shield is provided at a position overlapping with the magnetic field converter and the magnetic field detector, when viewed along the first direction.

8 Claims, 9 Drawing Sheets

MAGNETIC SENSOR DEVICE

The present application is based on and claims priority from Japanese Patent Application No. 2019-181747 filed on Oct. 1, 2019, the disclosure of which is incorporated herein by reference.

TECHNICAL FIELD

The present invention relates to a magnetic sensor device.

BACKGROUND

In recent years, in a variety of applications, physical quantity detection devices (position detection devices) for detecting physical quantities (for example, position and movement amount (change amounts) or the like caused by rotational movement or linear movement of a moving body) have been used. As such a physical quantity detection device, one equipped with a magnetic sensor capable of detecting change in an external magnetic field and a magnetic field generation unit (for example, a magnet) that can cause the position relative to the magnetic sensor to change, has been known, and a sensor signal in accordance with the change in the external magnetic field is output from the magnetic sensor.

As the magnetic sensor element, one in which a magnetic sensor element for detecting the detected magnetic field is provided on a substrate is known. As such a magnetic sensor element, a spin-valve-type magnetoresistive effect element (GMR element, TMR element or the like) in which resistance changes in accordance with change in the external magnetic field, or the like is used.

The spin-valve-type magnetoresistive effect element has a layered structure including at least a free layer, the magnetization direction of which can change in accordance with an external magnetic field, a magnetization fixed layer, the magnetization direction of which is fixed, and a nonmagnetic layer, which is interposed between the free layer and the magnetization fixed layer. In a magnetoresistive effect element having this kind of structure, the resistance value of the magnetoresistive effect element is determined by the angle formed by the magnetization direction of the free layer and the magnetization direction of the magnetization fixed layer. In addition, the magnetization direction of the free layer changes in accordance with the external magnetic field, and the angle formed by the magnetization directions of the free layer and the magnetization fixed layer changes because of this. Accordingly, the resistance value of the magnetoresistive effect element changes. Through the change in this resistance value, a sensor signal corresponding to the change in the external magnetic field is output. The spin-valve-type magnetoresistive effect element provided on a substrate is often configured to have sensitivity with respect to a magnetic field in a direction parallel to the surface of the substrate.

On the other hand, with a magnetic sensor, there is also a desire to detect a magnetic field in a direction perpendicular to the surface of the substrate, by means of the spin-valve-type magnetoresistive effect element provided on the substrate (see Patent Literature 1). As the above-described magnetic sensor, one that is used to detect the position of a magnet is known. In this magnetic sensor, a magnet is provided above the substrate on which the magnetoresistive effect element is provided, and a soft magnetic material is provided between the magnet and the magnetoresistive effect element. This soft magnetic material converts the perpendicular magnetic field component in a direction perpendicular to the substrate surface, of the components of the magnetic field generated by the magnet, into a magnetic field component that is parallel to the substrate surface to which the magnetoresistive effect element has sensitivity, and the converted magnetic field component is applied to the magnetoresistive effect element.

RELATED LITERATURE

Patent Literature

[Patent Literature 1] JP Laid-Open Patent Application No. 2015-129697

OVERVIEW OF THE INVENTION

Problem to be Solved by the Invention

In the above-described magnetic sensor, the magnetic field generated from the magnet and applied to the magnetoresistive effect element includes a horizontal magnetic field component in a direction parallel to the substrate surface, in addition to the perpendicular magnetic field component. In this case, in addition to the magnetic field component converted by the soft magnetic material, the horizontal magnetic field component generated from the magnet is also applied to the magnetoresistive effect element. Consequently, the problem arises that noise is generated in the output from the magnetic sensor in accordance with the strength of the magnetic field component to be originally detected (the magnetic field component converted by the soft magnetic material), and the sensitivity of the magnetic sensor is reduced.

In consideration of the foregoing, it is an object of the present invention to provide a magnetic sensor device with improved detection accuracy that can suppress the effects of magnetic field components other than the magnetic field component to be originally detected.

Means for Solving the Problem

In order to resolve the above-described problem, the present invention provides a magnetic sensor device including a magnetic field converter that receives an input magnetic field, which is input along a first direction, and outputs an output magnetic field along a second direction, which is orthogonal to the first direction. A magnetic field detector is provided at a position where the output magnetic field can be applied. A magnetic shield that blocks an external magnetic field along the second direction is provided. The magnetic field converter has a shape in which a length in a third direction, which is orthogonal to both the first direction and the second direction, is longer than a length in the second direction, when viewed along the first direction. The magnetic shield is provided at a position overlapping with the magnetic field converter and the magnetic field detector, when viewed along the first direction.

In the above-described magnetic sensor device, the magnetic shield may have a shape in which the maximum length in the second direction is shorter than the maximum length in the third direction, when viewed along the first direction, a plurality of the magnetic field converters may be arranged in parallel along the second direction, and the magnetic shield may include a first magnetic shield and a second magnetic shield, and the magnetic field converter and the magnetic field detector may be provided between the first magnetic shield and the second magnetic shield in the first direction.

The above-described magnetic sensor device may include a plurality of the magnetic field detectors, wherein the plurality of magnetic field detectors is provided in a position with linear symmetry centered on an axis along the lengthwise direction of the magnetic field converter, the axis passing through the center of the magnetic field converter in the short direction, when viewed along the first direction.

In the above-described magnetic sensor device, the magnetic field detector may include a magnetoresistive effect element, and the magnetoresistive effect element may have a magnetization fixed layer, in which the magnetization is fixed in the second direction, and a magnetization free layer, the magnetization direction of which changes in accordance with the output magnetic field that is applied.

In the above-described magnetic sensor device, the magnetic field detector may include a plurality of the magnetoresistive effect elements, with the magnetizations of the magnetization fixed layers of all of the magnetoresistive effect elements fixed in approximately the same direction, and the magnetic field detector may include a TMR element or a GMR element.

Efficacy of the Invention

With the present invention, it is possible to provide a magnetic sensor device with improved detection accuracy that can suppress the effects of magnetic field components other than the magnetic field component to be originally detected.

BEST MODE FOR IMPLEMENTING THE INVENTION

The best mode for implementing the invention will be described with reference to the drawings.

In a magnetic sensor device according to this embodiment, in some of the drawings the "X direction, Y direction and Z direction" are stipulated as necessary. Here, the X direction and the Y direction are mutually orthogonal directions within a plane substantially parallel to a first surface 104A and a second surface 104B (see FIG. 2) of a substrate 104 in this embodiment, and the Z direction is the direction of depth of the substrate 104 (the direction orthogonal to the first surface 104A and the second surface 104B of the substrate 104).

Figure 1:
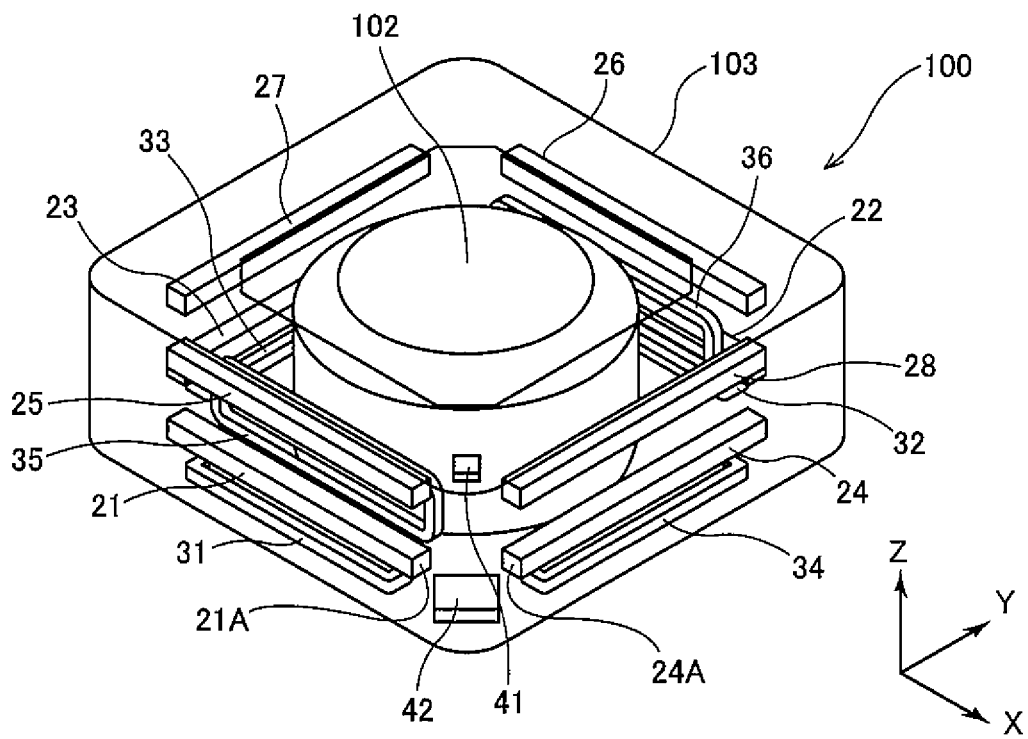
FIG. 1 is a perspective view showing a schematic configuration of a camera module that includes a magnetic sensor device according to one embodiment of the present invention.
Figure 2:
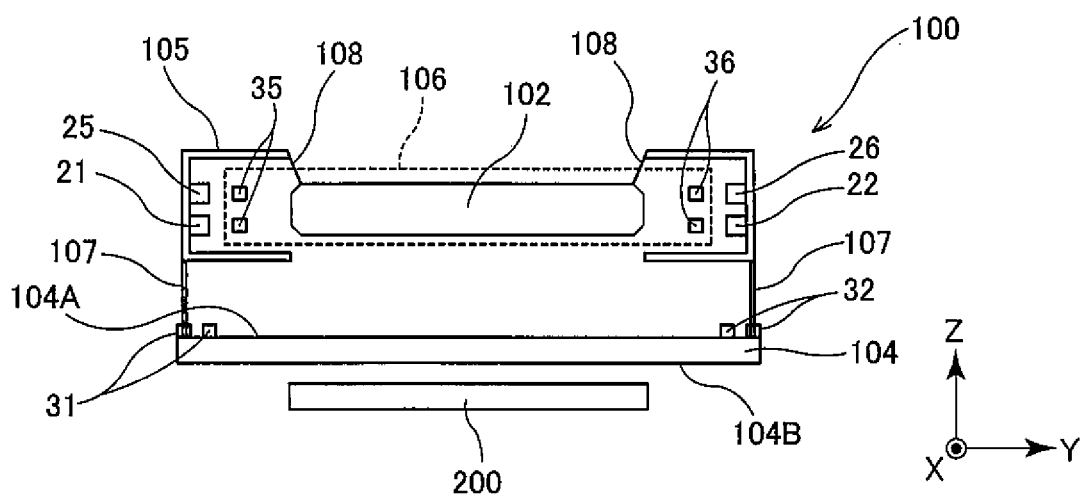
FIG. 2 is a schematic diagram schematically showing the internal structure of the camera module shown in FIG. 1.

The camera module 100 according to this embodiment is, for example, a part of a smart phone camera that includes an optical image stabilization mechanism and an auto-focus mechanism and is used in combination with an image sensor 200 using CMOS or the like (see FIG. 1 and FIG. 2).

The camera module 100 includes a drive device, a lens 102, a housing 103 and the substrate 104 (see FIG. 1 and FIG. 2). The drive device has the function of causing the lens 102 to move. The drive device includes a magnetic sensor device according to this embodiment. The housing 103 has the function of protecting the drive device. The substrate 104 includes the first surface 104A and the second surface 104B, which is opposite to the first surface 104A.

The lens 102 is positioned above the first surface 104A of the substrate 104 in an attitude such that the optical axis direction thereof is parallel to the Z direction. The substrate 104 has an aperture (not shown in the drawings) that lets in light that has passed through the lens 102. The camera module 100 is aligned with the image sensor 200 such that light that has passed through the lens 102 and the aperture of the substrate 104 is caused to be incident on the image sensor 200.

The drive device includes a first holding member 105, a second holding member 106, a plurality of first wires 107 and a plurality of second wires 108 (see FIG. 2). The second holding member 106 holds the lens 102, and, for example, may have a cylindrical shape in which the lens 102 can be mounted.

The second holding member 106 is provided such that the position thereof is changeable in one direction with respect to the first holding member 105, specifically in the direction parallel to the optical axis direction (the Z direction) of the lens 102. In this embodiment, the first holding member 105 has a box-like shape capable of housing on the inside thereof the lens 102 and the second holding member 106. The plurality of second wires 108 connects the first holding member 105 and the second holding member 106 and holds the second holding member 106 such that the second holding member 106 is moveable relative to the first holding member 105 along the Z direction.

The first holding member 105 is provided above the first surface 104A of the substrate 104 such that the position thereof is changeable with respect to the substrate 104 in at least one of the X direction and the Y direction. The plurality of first wires 107 connects the substrate 104 and the first holding member 105 and holds the first holding member 105 such that the first holding member 105 is moveable relative to the substrate 104 along at least one of the X direction and the Y direction. When the position of the first holding member 105 relative to the substrate 104 changes, the position of the second holding member 106 relative to the substrate 104 also changes.

Figure 3:
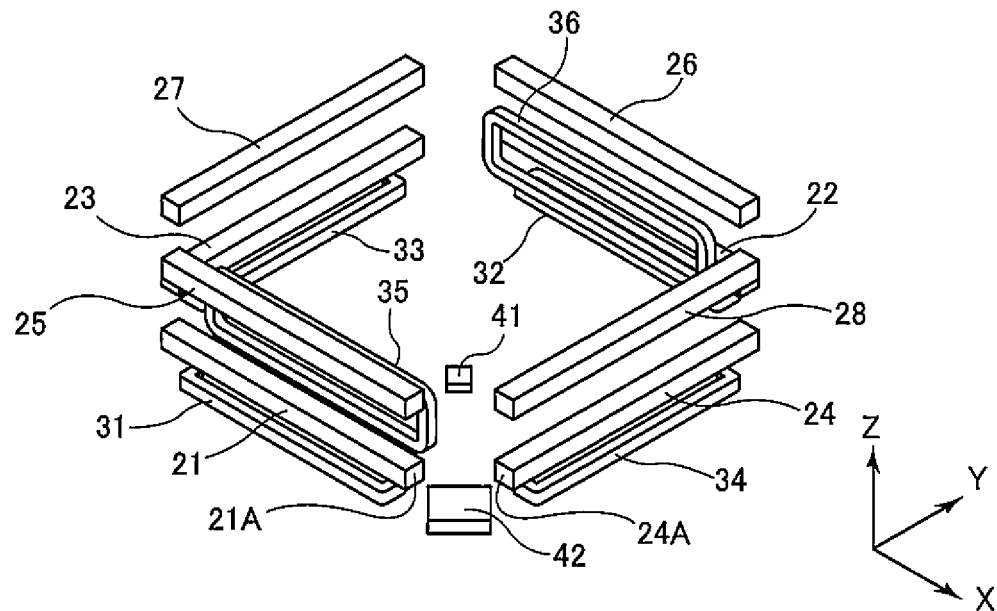
FIG. 3 is a perspective view showing the drive device of the camera module shown in FIG. 1.

The drive device includes a plurality of magnets (first through eighth magnets 21~28) and a plurality of coils (first through sixth coils 31~36) (see FIG. 1 and FIG. 3). The first magnet 21 and the second magnet 22 are positioned so that the lens 102 is between the first magnet 21 and the second magnet 22 along the Y direction. The third magnet 23 and the fourth magnet 24 are positioned so that the lens 102 is between the third magnet 23 and the fourth magnet 24 along the X direction. The fifth through eighth magnets 25~28 are positioned above (in the +Z direction from) the first through fourth magnets 21~24, respectively. The first through eighth magnets 21~28 are fixed to the first holding member 105.

Figure 6:
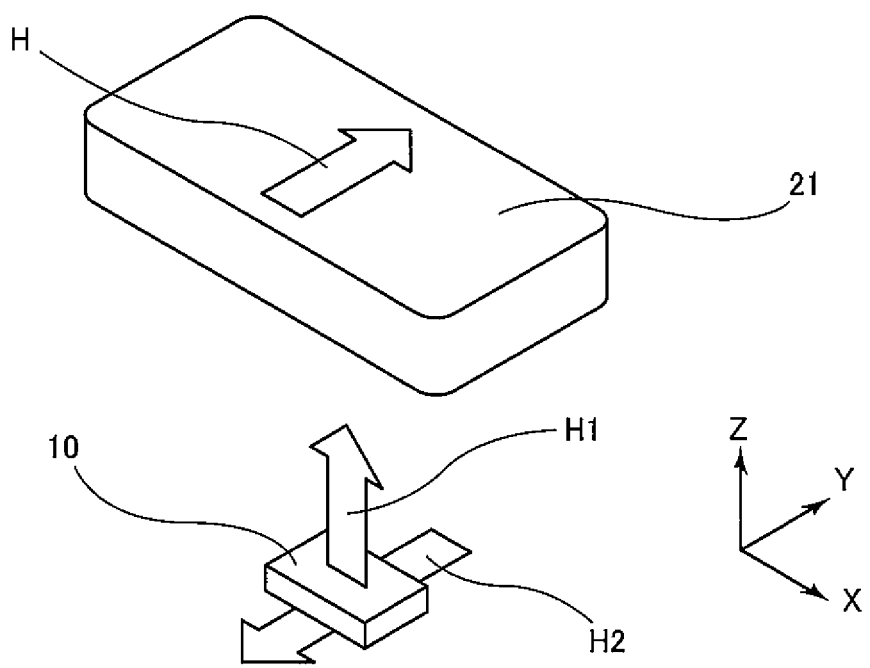
FIG. 6 is a perspective view showing the main parts of the magnetic sensor device according to one embodiment of the present invention.
Figure 7:
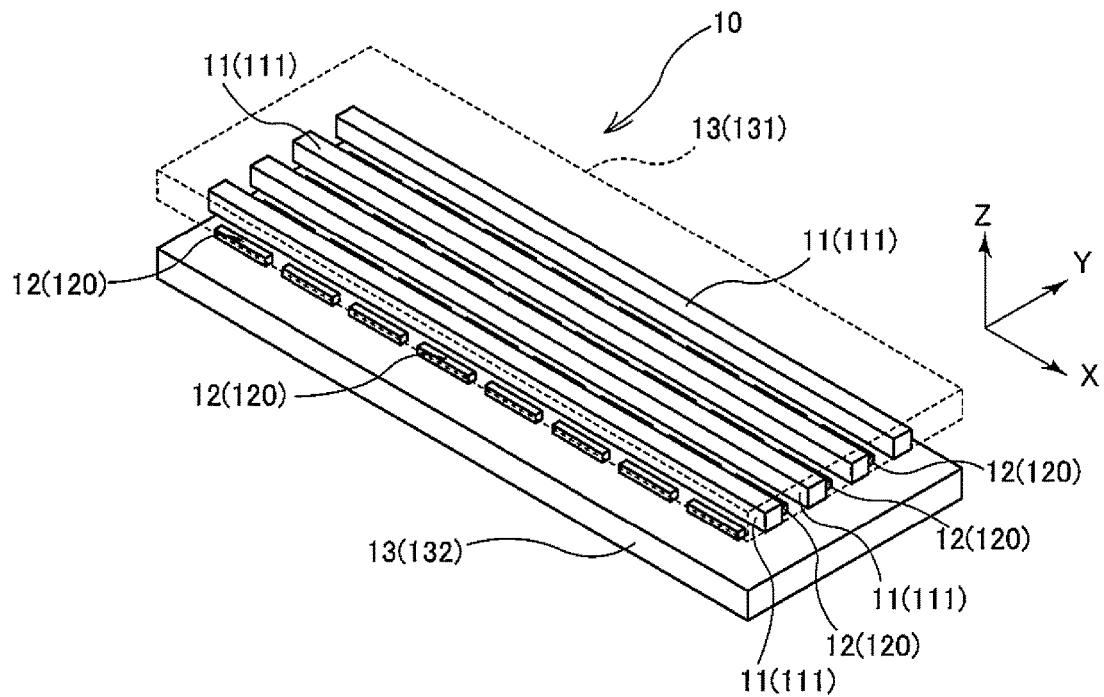
FIG. 7 is a perspective view showing the schematic configuration of the magnetic sensor according to one embodiment of the present invention.

The first magnet 21, the second magnet 22, the fifth magnet 25 and the sixth magnet 26 each have a rectangular parallelepiped shape with the lengthwise direction thereof in the X direction. The third magnet 23, the fourth magnet 24, the seventh magnet 27 and the eighth magnet 28 each have a rectangular parallelepiped shape with the lengthwise direction thereof in the Y direction (see FIG. 1 and FIG. 3). The magnetization direction H of the first magnet 21 (see FIG. 6) and the magnetization direction of the sixth magnet 26 are the +Y direction, and the magnetization directions of the second magnet 22 and the fifth magnet 25 are the −Y direction. The magnetization directions of the third magnet 23 and the eighth magnet 28 are the +X direction, and the magnetization directions of the fourth magnet 24 and the seventh magnet 27 are the −X direction.

The first coil 31 is positioned between the first magnet 21 and the substrate 104, and the second coil 32 is positioned between the second magnet 22 and the substrate 104 (see FIG. 2). The third coil 33 is positioned between the third magnet 23 and the substrate 104, and the fourth coil 34 is positioned between the fourth magnet 24 and the substrate 104. The fifth coil 35 is positioned between the lens 102 and the first magnet 21 and fifth magnet 25 and, and the sixth coil 36 is positioned between the lens 102 and the second magnet 22 and sixth magnet 26. The first through fourth coils 31~34 are fixed to the first surface 104A of the substrate 104, and the fifth coil 35 and the sixth coil 36 are fixed to the second holding member 106.

A magnetic field generated primarily from the first magnet 21 is applied to the first coil 31, a magnetic field generated primarily from the second magnet 22 is applied to the second coil 32, a magnetic field generated primarily from the third magnet 23 is applied to the third coil 33, and a magnetic field generated primarily from the fourth magnet 24 is applied to the fourth coil 34.

Figure 4:
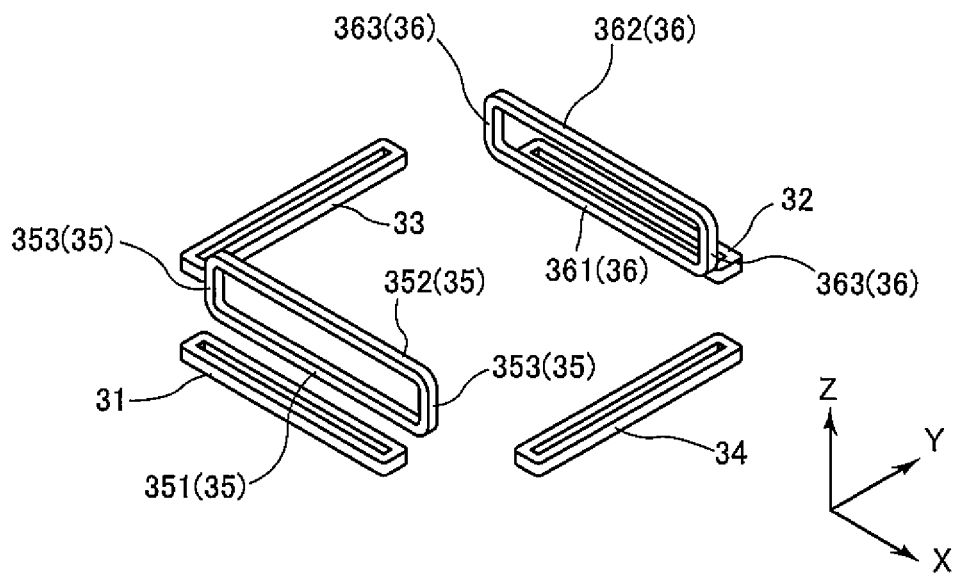
FIG. 4 is a perspective view showing a plurality of coils of the drive device shown in FIG. 3.

The fifth coil 35 includes a first conductor 351 extending in the X direction along the first magnet 21, a second conductor 352 extending in the X direction along the fifth magnet 25, and two third conductors 353 connecting in the Z direction one end of each of the first conductor 351 and the second conductor 352 and the other ends of each of the first conductor 351 and the second conductor 352 (see FIG. 4). The sixth coil 36 includes a first conductor 361 extending in the X direction along the second magnet 22, a second conductor 362 extending in the X direction along the sixth magnet 26, and two third conductors 363 connecting in the Z direction one end of each of the first conductor 361 and the second conductor 362 and the other ends of each the first conductor 361 and the second conductor 362 (see FIG. 4).

The component in the +Y direction of the magnetic field generated primarily from the first magnet 21 is applied to the first conductor 351 of the fifth coil 35. The component in the −Y direction of the magnetic field generated primarily from the fifth magnet 25 is applied to the second conductor 352 of the fifth coil 35. The component in the −Y direction of the magnetic field generated primarily from the second magnet 22 is applied to the first conductor 361 of the sixth coil 36. The component in the +Y direction of the magnetic field generated primarily from the sixth magnet 26 is applied to the second conductor 362 of the sixth coil 36.

Figure 5A:
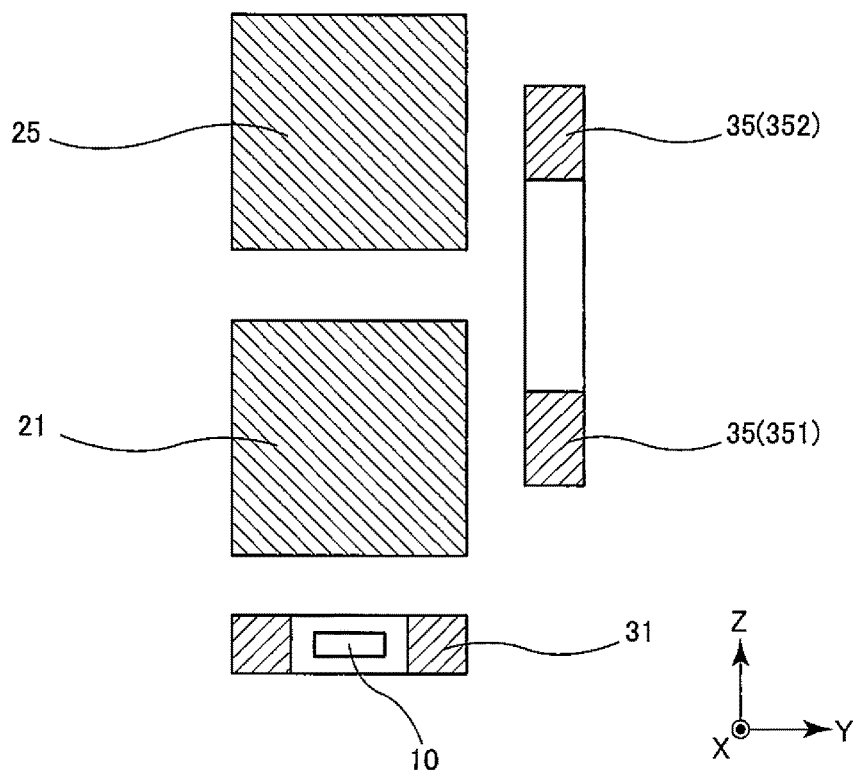
FIG. 5A is a cross-sectional view showing the main parts of the drive device shown in FIG. 3.
Figure 5B:
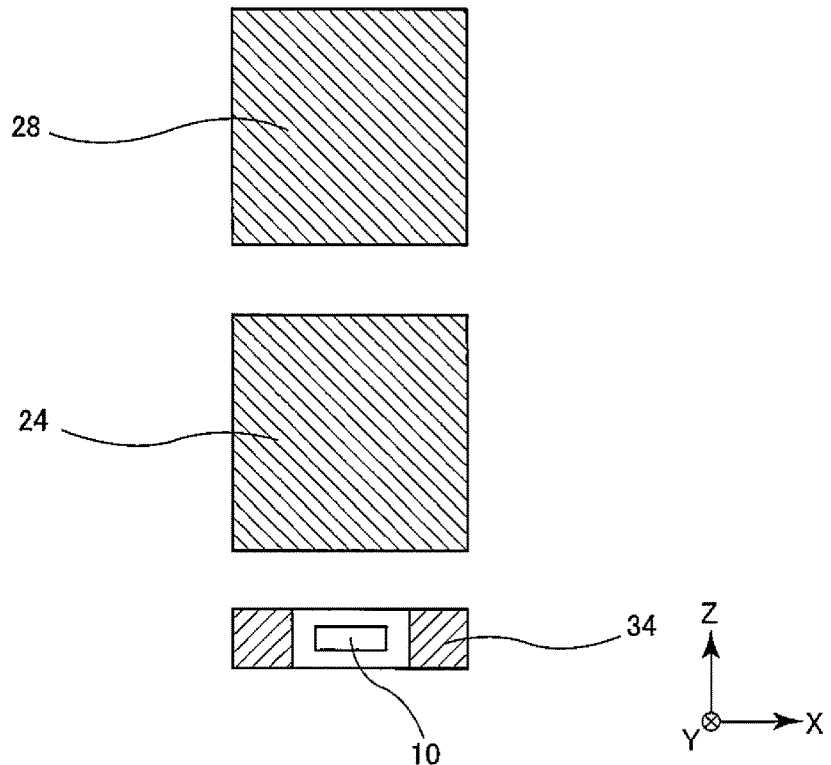
FIG. 5B is a cross-sectional view showing the main parts of the drive device shown in FIG. 3.

The drive device includes a magnetic sensor 10 fixed to the substrate 104 inside either the first coil 31 or the second coil 32, and a magnetic sensor 10 fixed to the substrate 104 inside either the third coil 33 or the fourth coil 34. In this embodiment, the two magnetic sensor 10 are positioned inside the first coil 31 and inside the fourth coil 34, respectively (see FIG. 5A, FIG. 5B). The two magnetic sensors 10 output sensor signals for changing the position of the lens 102 to reduce the effect of camera shake.

The magnetic sensor 10 positioned inside the first coil 31 detects the magnetic field generated from the first magnet 21 and outputs a sensor signal corresponding to the position of the first magnet 21. The magnetic sensor 10 positioned inside the fourth coil 34 detects the magnetic field generated from the fourth magnet 24 and outputs a sensor signal corresponding to the position of the fourth magnet 24. The configuration of each of the magnetic sensors 10 is described below.

The drive device includes a magnet 41 and a magnetic sensor 42 (see FIG. 1 and FIG. 3). The magnetic sensor 42 is used for detecting the position of the lens 102 when performing automatic focusing. The magnetic sensor 42 is fixed to the first surface 104A of the substrate 104 near an end face 21A of the first magnet 21 and an end face 24A of the fourth magnet 24. The magnetic sensor 42 may include, for example, a Hall element, and/or a magnetoresistive effect element such as an AMR element, a GMR element, and a TMR element.

The magnet 41 has a rectangular parallelepiped shape and is fixed to the second holding member 106 above the magnetic sensor 42. When the relative position of the second holding member 106 with respect to the first holding member 105 changes in a direction parallel to the Z direction, the relative position of the magnet 41 with respect to the first holding member 105 also changes in a direction parallel to the Z direction.

The action of the drive device will now be described.

The drive device makes up a portion of the optical image stabilization mechanism and the autofocus mechanism. The drive device, the optical image stabilization mechanism and the autofocus mechanism are controlled by an external control unit (not shown in the drawings) of the camera module 100.

The optical image stabilization mechanism is configured to be capable of detecting camera shake through a gyro sensor or the like external to the camera module 100, for example. When camera shake is detected by the optical image stabilization mechanism, the drive device is controlled so that the relative position of the lens 102 with respect to the substrate 104 changes in accordance with the mode of the camera shake. This makes it possible to stabilize the absolute position of the lens 102 and to reduce the effects of camera shake. The relative position of the lens 102 with respect to the substrate 104 changes in the X direction and the Y direction according to the mode of the camera shake.

The autofocus mechanism is configured to be capable of detecting the state in which the subject is in focus by using, for example, the image sensor 200 or an autofocus sensor or the like. The control unit causes the relative position of the lens 102 with respect to the substrate 104 to change in the Z direction through the drive mechanism to achieve a state of focus on the subject. This makes it possible to automatically focus on the subject.

The actions of the drive device relating to the optical image stabilization mechanism will now be described.

When an electric current is applied to the first coil 31 and the second coil 32 by the control unit, the first holding member 105 to which the first magnet 21 and the second magnet 22 are fixed moves in the Y direction through the mutual effect of the magnetic fields generated from the first magnet 21 and the second magnet 22 and the magnetic fields generated from the first coil 21 and the second coil 32. As a result, the lens 102 also moves in the Y direction. In addition, when an electric current is applied to the third coil 33 and the fourth coil 34 by the control unit, the first holding member 105 to which the third magnet 23 and the fourth magnet 24 are fixed moves in the X direction through the mutual effect of the magnetic fields generated from the third magnet 23 and the fourth magnet 24 and the magnetic fields generated from the third coil 33 and the fourth coil 34. As a result, the lens 102 also moves in the X direction. The control unit detects the position of the lens 102 based on signals corresponding to the positions of the first magnet 21 and the second magnet 24 detected by the two magnetic sensors 10.

The actions of the drive device relating to the autofocus mechanism will now be described. When the relative position of the lens 102 with respect to the substrate 104 is moved in the Z direction, the control unit applies an electric current on the fifth coil 35 so that an electric current flows in the +X direction in the first conductor 351 and an electric current flows in the −X direction in the second conductor 352 and applies an electric current on the sixth coil 36 so that an electric current flows in the −X direction in the first conductor 361 and an electric current flows in the +X direction in the second conductor 362. Due to these electric currents and the magnetic fields generated from the first magnet 21, the second magnet 22, the fifth magnet 25 and the sixth magnet 26, a Lorentz force in the Z direction acts on the first conductor 351 and the second conductor 352 of the fifth coil 35 and the first conductor 361 and the second conductor 362 of the sixth coil 36. Consequently, the second holding member 106, to which the fifth coil 35 and the sixth coil 36 are fixed, moves in the Z direction. As a result, the lens 102 also moves in the Z direction. When the relative position of the lens 102 is moved with respect to the substrate 104 in the −Z direction, the control unit causes electric currents to be applied to the fifth coil 35 and the sixth coil 36 in the opposite directions with respect to the above-described case of the lens 102 being caused to move in Z direction.

When the relative position of the lens 102 with respect to the substrate 104 changes in the Z direction, the relative position of the magnet 41 with respect to the magnetic sensor 42 also changes in the Z direction. The magnetic sensor 42 detects at least the magnetic field generated by the magnet 41 and creates a signal corresponding to the position of the magnet 41. The control unit detects the position of the lens 102 based on the signal created by the magnetic sensor 42.

The schematic configuration of the magnetic sensor device according to this embodiment will be described next.

The magnetic sensor device according to this embodiment includes the magnetic sensor 10, which is positioned inside the first coil 31, and the first magnet 21 as a magnetic field generation unit. In addition, the magnetic sensor device according to this embodiment includes the magnetic sensor 10, which is positioned inside the second coil 32, and the second magnet 22 as a magnetic field generation unit. Below, the description will take as an example the magnetic sensor device that includes the magnetic sensor 10 positioned inside the first coil 31 and the first magnet 21, but it goes without saying that the below description also applies to the magnetic sensor device that includes the magnetic sensor 10 positioned inside the second coil 32 and the second magnet 22.

In the magnetic sensor device, the magnetic sensor 10 and the first magnet 21 are configured such that a partial magnetic field that is a portion of the magnetic field generated from the first magnet 21 can be applied to the magnetic sensor 10. This partial magnetic field includes a first magnetic field component H1 parallel to the Z direction as a first direction, and a second magnetic field component H2 parallel to the Y direction as a second direction. In this embodiment, the magnetization direction H of the first magnet 21 is parallel to the Y direction and the direction of the second magnetic field component H2 that can be applied to the magnetic sensor 10 is parallel to the −Y direction (see FIG. 6).

As described above, the magnetic sensor 10 is fixed to the substrate 104 and the first magnet 21 is fixed to the first holding member 105. When the position of the first holding member 105 relative to the substrate 104 changes in the Y direction, the relative position of the first magnet 21 with respect to the magnetic sensor 10 also changes in the Y direction. The output from the magnetic sensor 10 corresponds to the relative position of the first magnet 21 with respect to the magnetic sensor 10 in the Y direction.

The magnetic sensor 10 and the first magnet 21 are configured so that when their relative position changes in the Y direction, the first magnetic field component H1 changes. In this embodiment, when the first holding member 105 moves in the Y direction and the relative position of the magnetic sensor 10 and the first magnet 21 changes, the first magnetic field component H1 changes.

The magnetic sensor 10 according to this embodiment includes a magnetic field converter 11 into which a magnetic field component (first magnetic field component H1) in the Z direction generated from the first magnet 21 is input as the input magnetic field. The magnetic field converter 11 converts this first magnetic field component H1 into a magnetic field component in the Y direction (third magnetic field component H3) and outputs such. A magnetic field detector 12 is provided at a position at which the third magnetic field component H3 can be applied as the output magnetic field output from the magnetic field converter 11. A magnetic shield 13 is provided for blocking the magnetic field component in the Y direction (the second magnetic field component H2) generated from the first magnet 21 from being applied to the magnetic field generation unit 12 as an external magnetic field (see FIG. 7 through FIG. 10).

The magnetic field converter 11 includes a plurality of yokes 111 made of a soft magnetic material. In this embodiment, an aspect in which the magnetic field converter 11 includes a plurality of yokes 111 is taken as an example, but this is intended to be illustrative and not limiting, for the magnetic field converter 11 may include one yoke 111.

Each of the plurality of yokes 111 has a shape such that the length in the X direction as a third direction is longer than the length in the Y direction, and for example, has a rectangular shape when viewed along the Z direction. The plurality of yokes 111 may be provided so that their lengthwise directions are parallel to the X direction when viewed along the Z direction or may be provided to be aligned along the Y direction. In this embodiment, the shape, the length in the lengthwise direction and the length in the short direction of the plurality of yokes 111 are the same, but it is fine if at least one of these differs. In addition, each of the yokes 111 is continuous in the X direction but may also be divided into multiple pieces in the X direction. The rectangular shape as the shape of each of the yokes 111 when viewed along the Z direction is one example, and this is intended to be illustrative and not limiting. For example, the shape of each of the yokes 111 when viewed along the Z direction may be a quadrilateral in which the four corners are 89~91° or may be a rectangle with four rounded corners.

Figure 15:
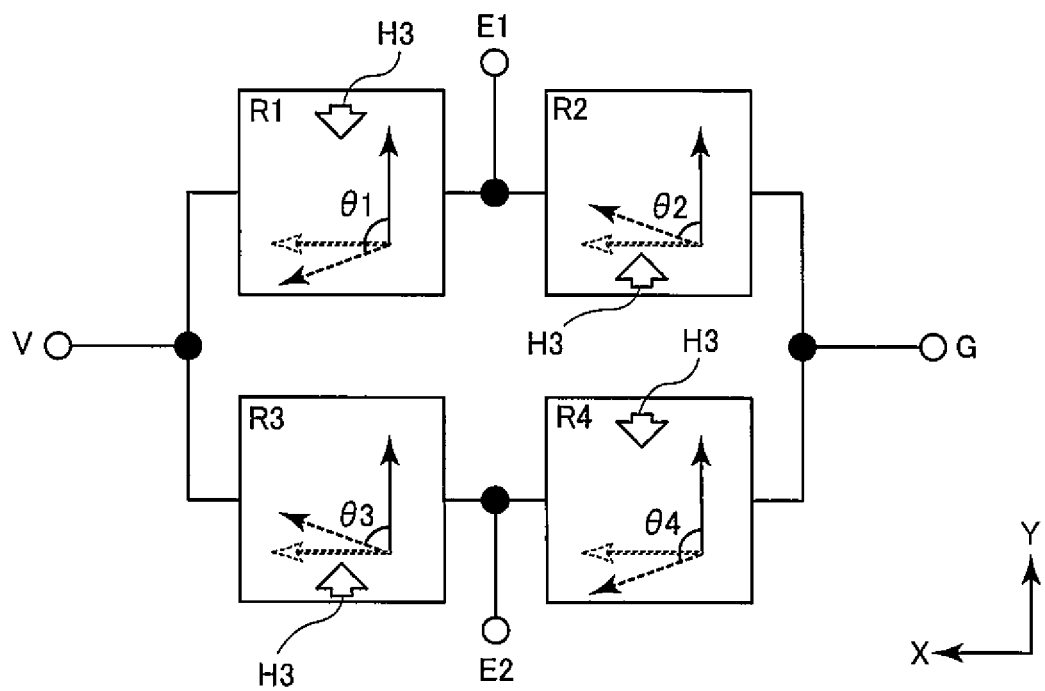
FIG. 15 is an explanatory diagram for explaining the magnetization directions of the free layer and the magnetization fixed layer when a third magnetic field component is applied on the magnetoresistive effect element according to one embodiment of the present invention.
Figure 16:
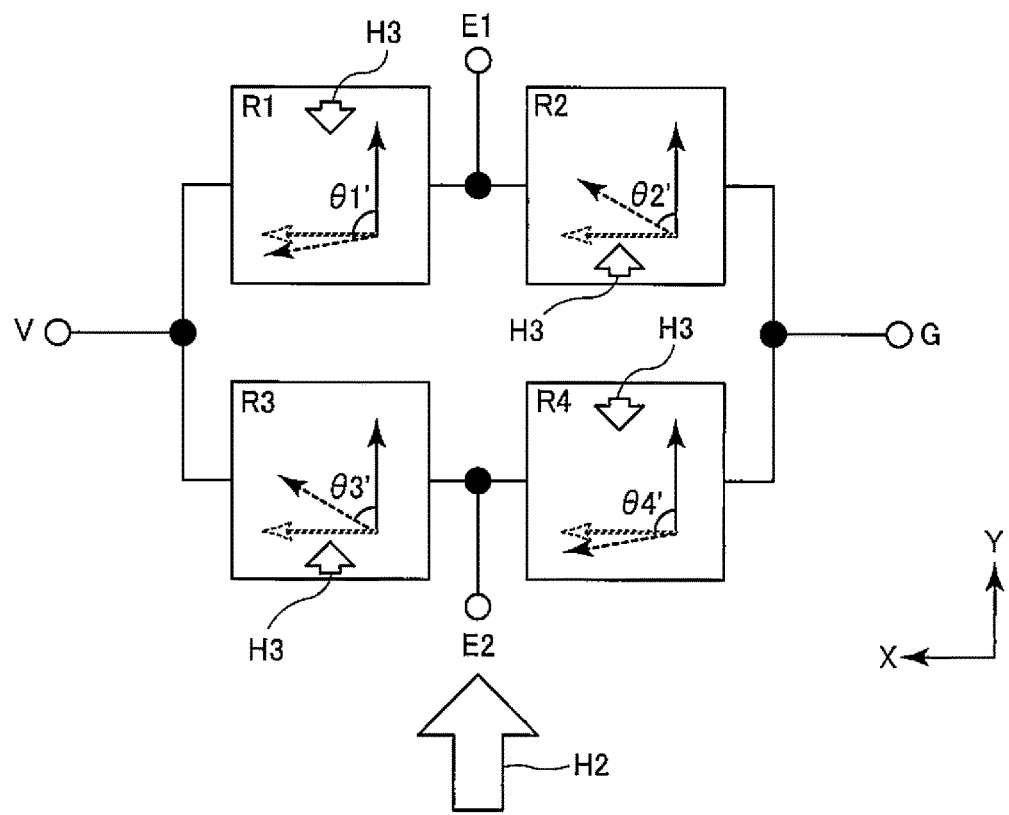
FIG. 16 is an explanatory diagram for explaining the magnetization directions of the free layer and the magnetization fixed layer when a second magnetic field component and a third magnetic field component are applied on the magnetoresistive effect element according to one embodiment of the present invention.

The magnetic field detector 12 outputs a signal corresponding to the change in the first magnetic field component H1 when the third magnetic field component H3 is applied (see FIG. 15 and FIG. 16). The magnetic field detector 12 only needs to include at least one magnetoresistive effect element 120. In this embodiment, the magnetic field detector 12 includes a first resistor unit R1, a second resistor unit R2, a third resistor unit R3 and a fourth resistor unit R4. Each of the first through fourth resistor units R1~R4 can include at least one magnetoresistive effect element 120, and each of the first through fourth resistor units R1~R4 includes an element row in which a plurality of magnetoresistive effect elements is connected in series. In the example shown in FIG. 8, the element rows included in each of the first through fourth resistor units R1~R4 have 16 magnetoresistive effect elements 120 connected in series.

Figure 11:
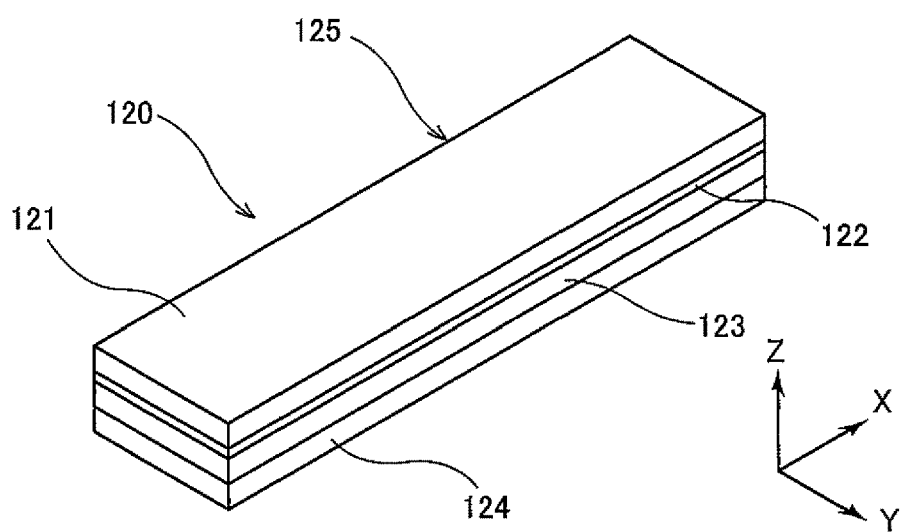
FIG. 11 is a perspective view showing the schematic configuration of a magnetoresistive effect element according to one embodiment of the present invention.

As the magnetoresistive effect elements 120 in this embodiment, for example, it is possible to use MR elements such as TMR elements, GMR elements or the like. The magnetoresistive effect elements 120 have an MR laminated body 125 that includes a free layer 121, a nonmagnetic layer 122, a magnetization fixed layer 123 and an antiferromagnetic layer 124 layered in that order (see FIG. 11). The antiferromagnetic layer 124 is made of an antiferromagnetic material and, by being exchange-coupled with the magnetization fixed layer 123, serves the role of fixing the direction of magnetization of the magnetization fixed layer 123. In addition, the antiferromagnetic layer 124 may be omitted by making the magnetization fixed layer 123 a so-called self-pinned fixed layer (synthetic ferri-pinned layer, or SFP layer) with a laminated ferri-structure of a ferromagnetic layer/nonmagnetic intermediate layer/ferromagnetic layer and in which the two ferromagnetic layers are antiferromagnetically coupled.

In a TMR element, the nonmagnetic layer 122 is a tunnel barrier layer. In a GMR element, the nonmagnetic layer 122 is a nonmagnetic conductive layer. In a TMR element or GMR element, the resistance value changes in accordance with the angle formed by the direction of magnetization of the free layer 121 and the direction of magnetization of the magnetization fixed layer 123, and the resistance value becomes a minimum when this angle is 0° (when the two magnetization directions are parallel), and the resistance value becomes a maximum when this angle is 180° (when these magnetization directions are anti-parallel).

Figure 12:
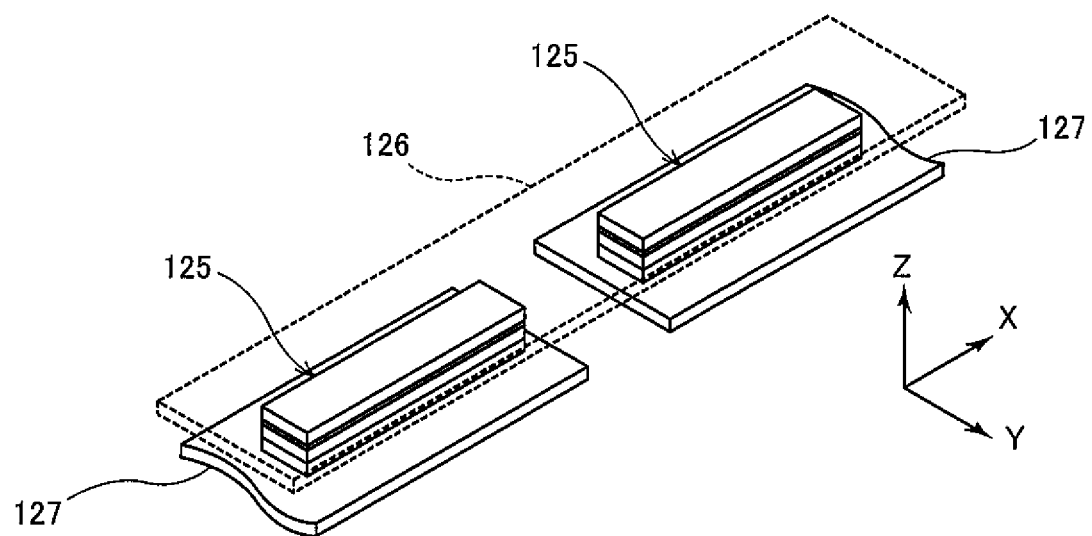
FIG. 12 is a perspective view showing the schematic configuration of the magnetic field detector according to one embodiment of the present invention.

The magnetoresistive effect element 120 may be such that when viewed along the Z direction, the plurality of roughly rectangular MR laminated bodies 125 is connected in series via an upper lead electrode 126 and a lower lead electrode 127 (see FIG. 12). In the MR laminated body 125 shown in FIG. 12, an electric current flows in the direction of lamination thereof (the +Z direction, -Z direction) but the magnetoresistive effect element 120 in this embodiment may also be an element of the Current in Plane (CIP) type in which an electric current flows in the in-plane direction (for example, the +X direction, -X direction) of the MR laminated body 125. The upper lead electrode 126 and the lower lead electrode 127 are made of one type of conductive material, or a compound film of two or more types of conductive material, of Cu, Al, Au, Ta, Ti or the like, for example. A roughly rectangular shape means, other than a rectangular shape the length of which in the X direction is longer than the length in the Y direction when viewed along the Z direction, a quadrilateral shape in which the length in the X direction is longer than the length in the Y direction and the four corners are 89~91°, and a rounded rectangular shape in which the length in the X direction is longer than the length in the Y direction and the four corners are rounded, and the like. In this embodiment, the shape of the MR laminated body 125 when viewed along the Z direction is not limited to a roughly rectangular shape but may be an elliptical shape, an oval shape or the like.

Each of the plurality of lower lead electrodes 127 has a long, slender roughly rectangular shape and is provided so that there is a prescribed gap between two adjacent lower lead electrodes 127 in the electrical series direction of the plurality of MR laminated bodies 125. The MR laminated bodies 125 are provided near each end of the lower lead electrodes 127 in the lengthwise direction. That is, two MR laminated bodies 125 are provided on each of the plurality of lower lead electrodes 127.

The plurality of upper lead electrodes 126 is provided on the plurality of MR laminated bodies 125. Each of the upper lead electrodes 126 has a long, slender, roughly rectangular shape. The upper lead electrodes 126 are positioned so that there is a prescribed gap between two adjacent upper lead electrodes 126 in the electrical series direction of the plurality of MR laminated bodies 125 and so that the plurality of MR laminated bodies 125 are connected in series, and two adjacent MR laminated bodies 125 are electrically connected to each other. A cap layer (protective layer) may be provided between the free layer 121 and the lower lead electrodes 127 or the upper lead electrodes 126.

When viewed along the Z direction, the plurality of magnetoresistive effect elements 120 included in the first resistor unit R1 and the plurality of magnetoresistive effect elements 120 included in the fourth resistor unit R4 are positioned on the -Y side of the magnetic field converter 11

Figure 8:
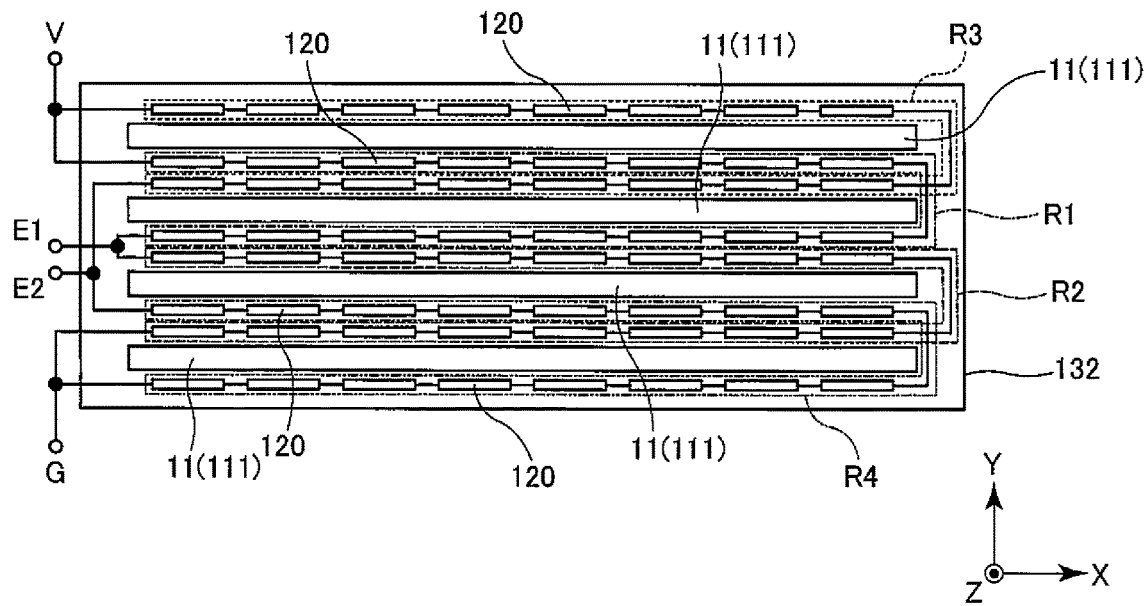
FIG. 8 is a plan view showing the schematic configuration of the magnetic sensor according to one embodiment of the present invention.
Figure 9:
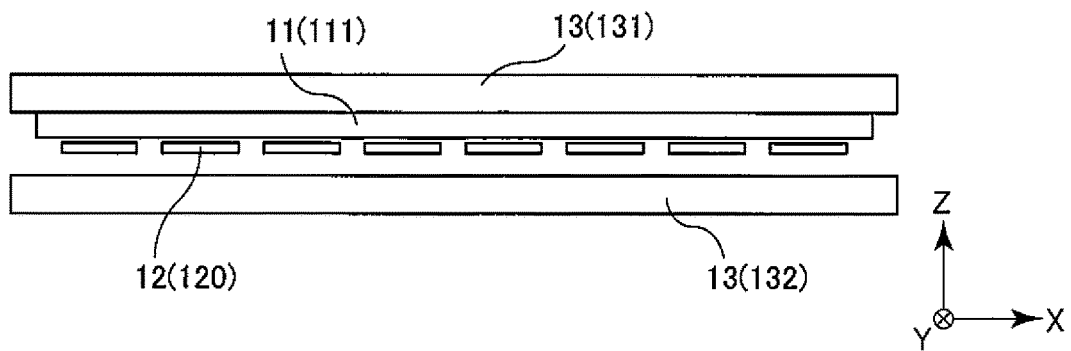
FIG. 9 is a side view showing the schematic configuration of the magnetic sensor according to one embodiment of the present invention.
Figure 10:
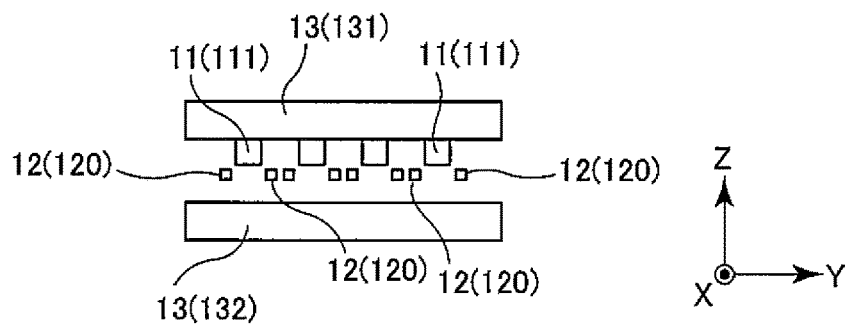
FIG. 10 is a side view showing the schematic configuration of the magnetic sensor according to one embodiment of the present invention.

(yoke 111), and the plurality of magnetoresistive effect elements 120 included in the second resistor unit R2 and the plurality of magnetoresistive effect elements 120 included in the third resistor unit R3 are positioned on the +Y side of the magnetic field converter 11 (yoke 111) (see FIG. 8). The plurality of magnetoresistive effect elements 120 are positioned to be line-symmetrical with respect to an axis (an axis extending in the lengthwise direction of the magnetic field converter 11 (yoke 111)) passing through the center of the magnetic field converter 11 (yoke 111) in the short direction (see FIG. 8). The configuration shown in FIG. 8 is intended to be illustrative and not limiting, for the length (length in the Y direction) between the above-described axis of at least one of the magnetic field converters 11 (yoke 111) and the magnetoresistive effect element 120 positioned on the +Y side of this magnetic field converter 11 (yoke 111) and the length (length in the Y direction) between the above-described axis of that magnetic field converter 11 (yoke 111) and the magnetoresistive effect element 120 positioned on the −Y side of this magnetic field converter 11 (yoke 111) may be substantially the same or may be mutually different. These two lengths being substantially the same as each other means that the ratio of the two lengths is around 1:0.95~1:1.05. In addition, the plurality of magnetoresistive effect elements 120 need not be positioned at positions of linear symmetry centered on the above-described axis of at least one of the magnetic field converters 11 (yoke 111).

When viewed along the Z direction, the magnetic shield 13 includes a first magnetic shield 131 and a second magnetic shield 132 (see FIG. 7~FIG. 10) positioned so that the magnetic field converter 11 and the magnetic field detector 12 are between the first magnetic shield 131 and the second magnetic shield 132. When viewed along the Z direction, the first magnetic shield 131 is positioned to the +Z direction (upward) from the magnetic field converter 11 and the magnetic field detector 12, and the second magnetic shield 132 is positioned in the −Z direction (downward) from the magnetic field converter 11 and the magnetic field detector 12. When viewed along the Z direction, the first magnetic shield 131 and the second magnetic shield 132 should both have a shape in which the maximum length in the Y direction is shorter than the maximum length in the X direction, and for example, should have a shape such as a rectangular shape, a quadrilateral shape in which the angles of the four corners are 89~91°, a rounded rectangular shape in which the four corners are rounded, a shape in which the four corners of a rectangle are beveled (an octagonal shape), an oval shape including an elliptical shape, a shape in which the two short sides facing the rectangle are in an arc shape, a trapezoid, a parallelogram, a rhombus or the like. When the magnetic shield 13 including the first magnetic shield 131 and the second magnetic shield 132 has, for example, a quadrilateral shape such as a quadrilateral shape in which the angles of the four corners are 89~91°, a trapezoid, a rhombus or the like, one set of two opposing sides of the two sets of two opposing sides may be parallel, or the two sets of two opposing sides may each be non-parallel.

The magnetic shield 13 may be made of a soft magnetic material, for example. As a soft magnetic material, NiFe or the like can be cited, for example. When the magnetic shield 13 is made of NiFe, the thermal stress of the magnetic shield is reduced, so the magnetic shield 13 is preferably made of NiFe having a composition in which the ratio of Ni is 35~60 wt %. With NiFe having this composition, it is possible to reduce the coefficient of thermal expansion. When the magnetic properties of the magnetic shield 13 are also taken into consideration, the magnetic shield 13 is preferably made of NiFe having a composition in which the Ni ratio is 40~60 wt %. One of the performance requirements for the magnetic shield 13 is that the maximum magnetic flux absorption is large. The maximum magnetic flux absorption of the magnetic shield 13 is substantially proportional to the product of the thickness (dimension in the Z direction) and the saturation magnetization of the magnetic shield 13. In order to ensure the performance of the magnetic shield 13, the product of the thickness and the saturation magnetization of the magnetic shield 13, that is, the magnetic moment per unit area, is preferably 0.6 emu/cm$^2$ or greater.

In this embodiment, when viewed along the Z direction, the magnetic shield 13 includes the first magnetic shield 131 positioned upward (the +Z side) from the magnetic field converter 11 and the magnetic field detector 12, and the second magnetic shield 132 positioned downward (the −Z side) from the magnetic field converter 11 and the magnetic field detector 12, but as long as the function of the magnetic shield 13 is realized, either of the first magnetic shield 131 and the second magnetic shield 132 may be omitted. In addition, at least one of the first magnetic shield 131 and the second magnetic shield 132 may have a plurality of magnetic shields lined up in the Y direction. By lining up a plurality of magnetic shields in the Y direction, the magnetic shield is less likely to become saturated.

Figure 13:
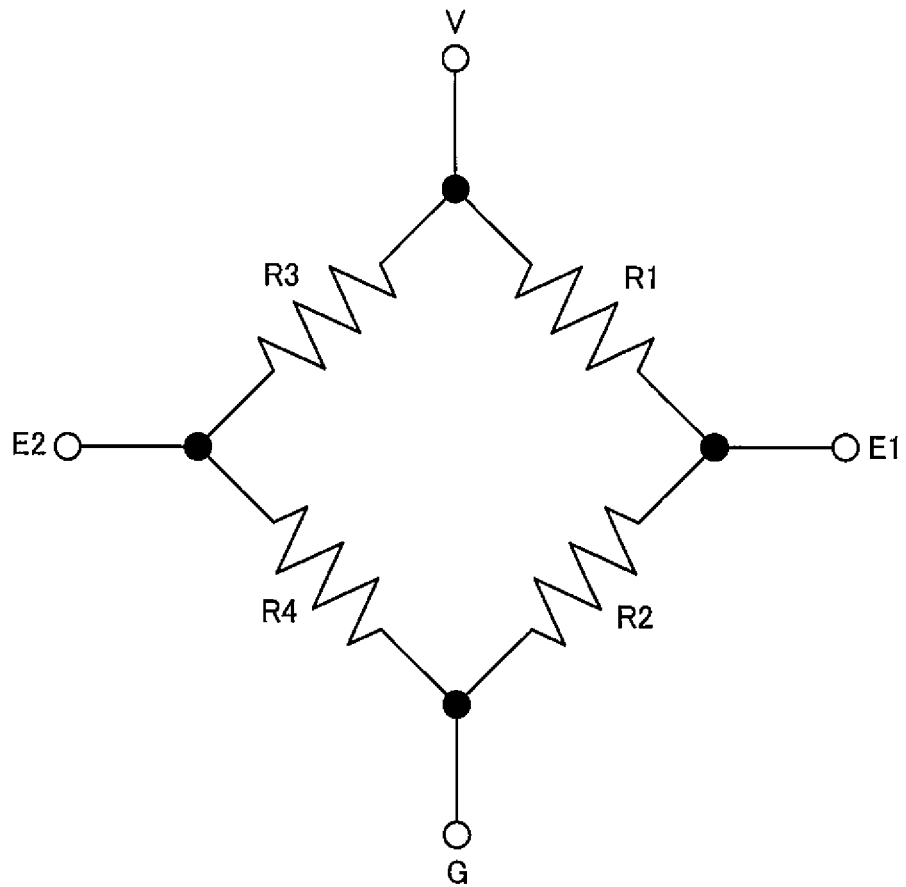
FIG. 13 is a circuit diagram showing the circuit configuration of the magnetic field detector according to one embodiment of the present invention.

The circuit configuration of the magnetic field detector 12 in this embodiment can be a Wheatstone bridge circuit in which four resistor units (first through fourth resistor units R1~R4) are bridge-connected (see FIG. 13). The circuit configuration of this magnetic field detector 12 may also be a half-bridge circuit in which two resistor units (for example, the first resistor unit R1 and the second resistor unit R2) are connected in series.

The Wheatstone bridge circuit includes a power source port V, a ground port G, a first output port E1, a second output port E2, the first resistor unit R1 provided between the power source port V and the first output port E1, the second resistor unit R2 provided between the first output port E1 and the ground port G, the third resistor unit R3 provided between the power source port V and the second output port E2, and the fourth resistor unit R4 provided between the second output port E2 and the ground port G. A power source voltage (constant current) of a prescribed magnitude is applied to the power source port V by connecting a constant current source, and the ground port G is connected to ground.

Figure 14:
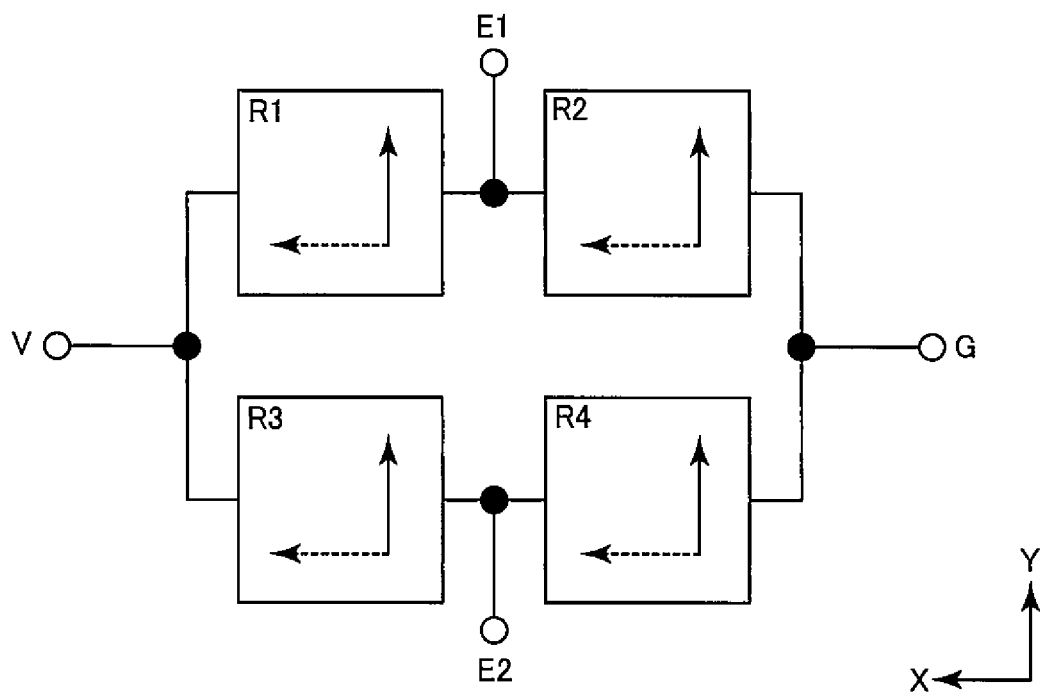
FIG. 14 is an explanatory diagram for explaining the magnetization directions in the initial state of the free layer and the magnetization fixed layer of the magnetoresistive effect element according to one embodiment of the present invention.

In this embodiment, the magnetization direction of the magnetization fixed layer 123 of all of the MR laminated bodies 125 (the solid arrows shown in FIG. 14~FIG. 16) are fixed in the same direction (the +Y direction) (see FIG. 14~FIG. 16). The magnetization directions of the magnetization fixed layers in all the MR laminated bodies 125 should be fixed in roughly the same direction. In this case, the magnetization direction of the magnetization fixed layer 123 in each of the MR laminated bodies 125 should be inclined at an angle of 10° or less with respect to the +Y direction. When viewed along the Z direction, all the MR laminated bodies 125 have a shape that is long in the X direction, so the free layer 121 in each of the MR laminated bodies 125 has shape anisotropy in which the easy magnetization axis direction is the X direction. Consequently, the magnetization directions of the free layers 121 in all the MR laminated bodies 125 in the initial state (the state in which the third magnetic field component H3 is not applied) (the dashed arrows shown in FIG. 14~FIG. 16) are the same. The magnetization directions are orthogonal (+X direction) to the magnetization directions of the magnetization fixed layers 123 (see FIG. 14). By the magnetization directions of the magnetization fixed layer 123 and the free layer 121 being the above-described directions, the electric potential difference between the first output port E1 and the second output port E2 changes accompanying changes in the resistance value of the first through fourth resistor units R1~R4 corresponding to the third magnetic field component H3, and a signal is output as this change in the electric potential difference.

In the magnetic sensor device according to this embodiment, when a magnetic field is generated from the first magnet 21, the first magnetic field component H1 parallel to the Z direction of the partial magnetic fields that are one part of this magnetic field is converted into the third magnetic field component H3 by the magnetic field converter 11 and is output. The third magnetic field component H3 output from the magnetic field converter 11 includes the third magnetic field component H3 in the +Y direction and the third magnetic field component H3 in the −Y direction. The third magnetic field component H3 in the −Y direction is applied to the magnetoresistive effect elements 120 included in the first resistor unit R1 and the fourth resistor unit R4. Accordingly, the magnetization direction of the free layer 121 changes. On the other hand, the third magnetic field component H3 in the +Y direction is applied to the magnetoresistive effect elements 120 included in the second resistor unit R2 and the third resistor unit R3, and the magnetization direction of free layer 121 changes (see FIG. 15) accordingly. As a result, the angles θ1 and θ4 formed by magnetization of the free layer 121 and the magnetization fixed layer 123 in the first resistor unit R1 and the fourth resistor unit R4 exceed 90°. On the other hand, the angles θ2 and θ3 formed by magnetization of the free layer 121 and the magnetization fixed layer 123 in the second resistor unit R2 and the third resistor unit R3 becomes less than 90° (see FIG. 15). In FIG. 15, the dashed arrows indicate the magnetization of the free layer 121, the direction of which has changed through the application of the third magnetic field component H3, and the white dashed arrows indicate the magnetization direction of the free layer 121 in the initial state.

The second magnetic field component H2, which is parallel to the Y direction, is included in the partial magnetic field that is a portion of the magnetic field generated from the first magnet 21. Most of the second magnetic field component H2 is absorbed by the magnetic shield 13, but this does not mean that the entirety of the second magnetic field component H2 is absorbed by the magnetic shield 13. A portion of the second magnetic field component H2 is applied to the magnetoresistive effect elements 120, and the magnetization direction of the free layers 121 changes (see FIG. 16). In FIG. 16, the dashed arrows indicate the magnetization of the free layers 121 in which the direction has changed by the application of the third magnetic field component H3, and the white dashed arrows indicate the magnetization direction of the free layers 121 in the initial state. Through this, the angles θ01', θ2', θ3' and θ4' formed by the magnetizations of the magnetization fixed layers 123 and the free layers 121 in the first resistor unit R1, the second resistance unit R2, the third resistance unit R3 and the fourth resistance unit R4 become smaller than the angles θ1, θ2, θ3 and θ4 that should be shown when the second magnetic field component H2 is not applied (see FIG. 15). As a result, the respective outputs of the first output port E1 and the second output port E2 fluctuate, but in this embodiment, the magnetization of the magnetization fixed layers 123 of all of the magnetoresistive effect elements 120 included in the first through fourth resistor units R1~R4 are fixed in the same direction, and the magnetization in the initial state of the free layers 121 of all of the magnetoresistive effect elements 120 are in the same direction, so when a portion of the second magnetic field component H2 is applied to the magnetoresistive effect elements 120, the amount of fluctuation in the output of the first output port E1 and the amount of fluctuation in the output of the second output port E2 are substantially equal. When the amount of fluctuation in the output of the first output port E1 and the amount of fluctuation in the output of the second output port E2 differ due to the second magnetic field component H2, the output from the magnetic sensor device may be offset. In this embodiment, it is possible to suppress the occurrence of offset in the output from the magnetic sensor device. In addition, in this embodiment, the magnetization direction of the free layer 121 in the initial state is orthogonal to the second magnetic field component H2, so it is possible to suppress a decrease in the sensitivity of the magnetic sensor device.

The above-described embodiment was disclosed in order to facilitate understanding of the present invention and was not disclosed in order to limit the present invention. Accordingly, all elements disclosed in the above-described embodiment shall be construed to include all design modifications and equivalents falling within the technical scope of the present invention.

Embodiments

Below, the present invention will be described in greater detail by presenting embodiments or the like, but the present invention is in no way limited by the below-described embodiments or the like.

Test Example 1

Figure 17:
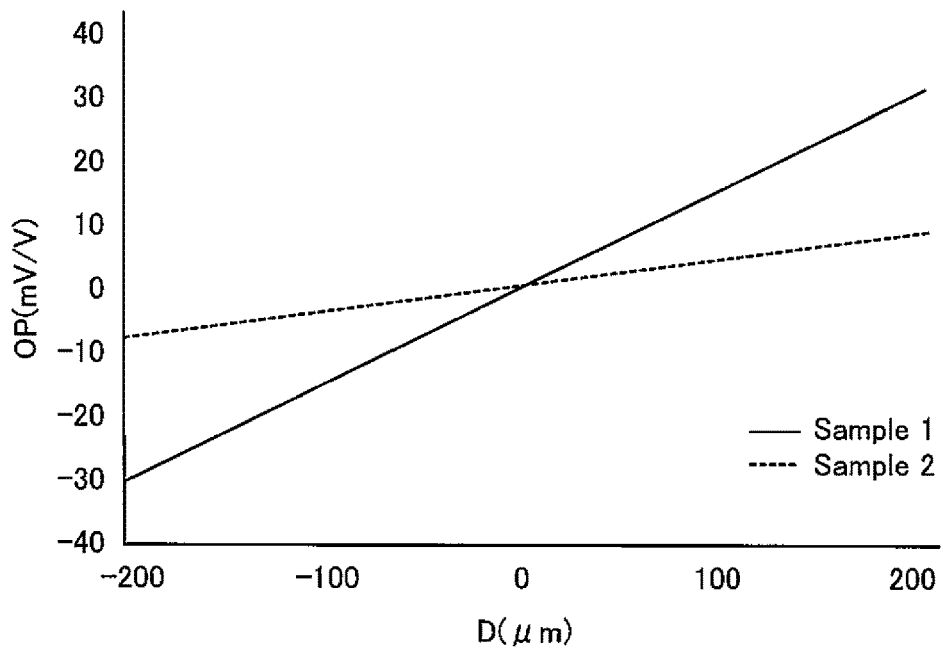
FIG. 17 is a graph showing the results of Test Example 1.

Using a magnetic sensor 10 (Sample 1) having the configuration shown in FIG. 6~FIG. 10, the fluctuation in the output of the magnetic sensor 10 was found through simulation when causing the distance between the first magnet 21 and the magnetic sensor 10 to fluctuate in the +Y direction and the −Y direction from a prescribed position. Similarly, using magnetic sensor 10 (Sample 2) not having the magnetic shield 13 (first magnetic shield 131 and second magnetic shield 132), the fluctuation in the output of the magnetic sensor 10 was found through simulation. The results are shown in FIG. 17. In FIG. 17, the horizontal axis indicates the fluctuation distance (D) in the +Y direction and −Y direction from the prescribed position, and the vertical axis indicates the output (OP) of the magnetic sensor 10. Zero on the horizontal axis (D) indicates the aforementioned prescribed position, and the vertical axis (OP) indicates the difference between the output of the magnetic sensor 10 when the distance between the first magnet 21 and the magnetic sensor 10 has been caused to fluctuate and the output of the magnetic sensor 10 at that prescribed position. In addition, in Sample 1, the magnetic field strength of the second magnetic field component H2 applied to the magnetic sensor 10 is 10% of the magnetic field strength of the second magnetic field component H2 generated from the first magnet 21. In Sample 2, the magnetic field strength of the second magnetic field component H2 applied to the magnetic sensor 10 is 100% of the magnetic field strength of the second magnetic field component H2 generated from the first magnet 21. Furthermore, in Sample 1 and Sample 2, the magnetic field strength of the first magnetic field component H1 generated from the first magnet 21 is taken to be 24.5 mT (millitesla), the magnetic field strength of the third magnetic field component H3 is taken to be 15% of the magnetic field strength of the first magnetic field component H1, and the sensitivity of the magnetic sensor 10 is taken to be 100 (mV/V/deg).

As is clear from the results shown in FIG. 17, in the magnetic sensor 10 of Sample 1, it is possible to obtain a greater output than from the magnetic sensor 10 of Sample 2. From this, while the sensitivity of the magnetic sensor 10 decreases due to the second magnetic field component H2 being applied to the magnetic sensor 10, it is possible to suppress a decrease in the sensitivity of the magnetic sensor 10 by having a magnetic shield 13 capable of absorbing the second magnetic field component H2 as in the magnetic sensor 10 of Sample 1. On the other hand, when the sensitivity of the magnetic sensor 10 decreases due to the second magnetic field component H2 as in Sample 2, it is necessary to greatly amplify the output of the magnetic sensor 10, but when the output of the magnetic sensor 10 is greatly amplified, the problem arises that noise contained in the output of the magnetic sensor 10 also becomes larger.

Test Example 2

In the magnetic sensor 10 of the above-described Sample 1, the change ratio (%) of the sensitivity of the magnetic sensor 10 was found through simulation when the magnetic field strength of the second magnetic field component H2 was increased. In addition, in the magnetic sensor 10 of Sample 1, the change ratio (%) of the sensitivity of the magnetic sensor was similarly found for a magnetic sensor (Sample 3) in which the lengthwise direction of the magnetic field converter 11 (yoke 111) was changed from the X direction to the Y direction and the magnetic field detectors 12 (magnetoresistive effect elements 120) were positioned on both sides in the short direction (the +X side and the −X side) of the magnetic field converter 11 (yoke 111) when viewed along the Z direction. The change ratio (%) of the sensitivity can be found as a percentage of the difference between the sensitivity when the magnetic field strength of the second magnetic field component H2 is increased, to the sensitivity when the second magnetic field component H2 is not applied (when the magnetic field strength of the second magnetic field component H2 is 0 mT (millitesla)). As a result, in Sample 1, the change ratio of the sensitivity when the magnetic field strength of the second magnetic field component H2 is 10 mT was 0.6%. On the other hand, in Sample 3, the change ratio of the sensitivity when the magnetic field strength of the second magnetic field component H2 is 10 mT was 2.7%. From this, it was confirmed that with the magnetic sensor 10 according to this embodiment, it is possible to further suppress a decrease in sensitivity caused by the second magnetic field component H2.

DESCRIPTION OF SYMBOLS

10—Magnetic sensor device
11—Magnetic field converter
111—Yoke
12—Magnetic field detector
120—Magnetoresistive effect element
13—Magnetic shield
131—First magnetic shield
132—Second magnetic shield

What is claimed is:

1. A magnetic sensor device comprising:
    a magnetic field converter that receives an input magnetic field, which is input along a first direction, and outputs an output magnetic field along a second direction, which is orthogonal to the first direction;
    a magnetic field detector provided at a position where the output magnetic field can be applied; and
    a magnetic shield that blocks an external magnetic field along the second direction,
    wherein the magnetic field converter has a shape in which a length in a third direction, which is orthogonal to both the first direction and the second direction, is longer than a length in the second direction, when viewed along the first direction; and
    the magnetic shield is provided at a position overlapping with the magnetic field converter and the magnetic field detector, when viewed along the first direction.

2. The magnetic sensor device according to claim 1, wherein the magnetic shield has a shape in which a maximum length in the second direction is shorter than a maximum length in the third direction, when viewed along the first direction.

3. The magnetic sensor device according to claim 1, wherein a plurality of the magnetic field converters are arranged in parallel in the second direction.

4. The magnetic sensor device according to claim 1, wherein
    the magnetic shield includes a first magnetic shield and a second magnetic shield; and
    the magnetic field converter and the magnetic field detector are provided between the first magnetic shield and the second magnetic shield in the first direction.

5. The magnetic sensor device according to claim 1, further comprising a plurality of the magnetic field detectors, wherein the plurality of magnetic field detectors is provided in a position with linear symmetry centered on an axis along the lengthwise direction of the magnetic field converter, the axis passing through the center of the magnetic field converter in the short direction, when viewed along the first direction.

6. The magnetic sensor device according to claim 1, wherein:
    the magnetic field detector includes a magnetoresistive effect element; and
    the magnetoresistive effect element has a magnetization fixed layer, in which the magnetization is fixed in the second direction, and a magnetization free layer, the magnetization direction of which changes in accordance with the output magnetic field that is applied.

7. The magnetic sensor device according to claim 6, wherein:
    the magnetic field detector includes a plurality of the magnetoresistive effect elements; and
    the magnetizations of the magnetization fixed layers of all the magnetoresistive effect elements are fixed in approximately the same direction.

8. The magnetic sensor device according to claim 1, wherein the magnetic field detector includes a TMR element or a GMR element.

* * * * *